US006448525B1

(12) United States Patent
Nishioka et al.

(10) Patent No.: US 6,448,525 B1
(45) Date of Patent: Sep. 10, 2002

(54) CAPACITOR CHARACTERISTICS MEASUREMENT AND PACKING APPARATUS

(75) Inventors: Yoshinao Nishioka, Shiga-ken; Mitsuru Kitagawa, Yokaichi; Masao Nishimura, Shiga-ken; Toshinari Tabata, Otsu, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/056,320

(22) Filed: Apr. 7, 1998

(30) Foreign Application Priority Data

Apr. 8, 1997 (JP) ............................................ 9-106765
Mar. 23, 1998 (JP) .......................................... 10-095458

(51) Int. Cl.[7] .......................... B07C 5/344; G01R 31/12
(52) U.S. Cl. .................... 209/574; 209/919; 324/158.1; 324/548; 324/759; 53/54; 53/493
(58) Field of Search ................................ 209/571, 573, 209/574, 919; 324/158.1, 548, 754, 759; 53/54, 493, 534

(56) References Cited

U.S. PATENT DOCUMENTS 3,179,248 A * 4/1965 Manley .................. 209/574 X
4,564,110 A * 1/1986 Kasprzyk ................ 209/574 X
5,131,206 A * 7/1992 Sillner .................... 209/573 X
5,673,799 A * 10/1997 Braden ................... 324/537 X

FOREIGN PATENT DOCUMENTS

EP 427611 * 5/1991 ................ 209/574

* cited by examiner

*Primary Examiner*—Tuan N. Nguyen
(74) *Attorney, Agent, or Firm*—Ostrolenk, Faber, Gerb & Soffen, LLP

(57) ABSTRACT

Capacitor characteristics measurement apparatus and packing apparatus includes a turntable (1) intermittently driven at a constant pitch to supply capacitors (C) from a parts feeder (8) to a holder section (2) of the turntable (1) in a one-by-one manner. A capacitance measurement section (4) and an IR prediction section (5) are provided to determine whether each capacitor is acceptable or defective in quality based on the measured values obtainable from these sections (4, 5). The IR prediction section (5) applies a DC voltage to a capacitor while predicting the current value at termination of chargeup by use of its initial current value in the charge region of an insulation polarization component thereof upon application of the voltage thereto. A defective product ejection section (6) is provided for ejecting defective capacitors and an acceptable product extraction section (7) is provided for putting acceptable capacity into a storage section (31*a*) of a base material tape (31) conveyed by a taping device (30) and then packing the acceptable capacity by a process including a step of pasting a cover tape onto the base material tape (31).

6 Claims, 15 Drawing Sheets

CAPACITOR CHARACTERISTICS MEASUREMENT AND PACKING APPARATUS

BACKGROUND OF THE INVENTION

1. Field of the Invention

The present invention relates in general to capacitor characteristics measurement/packing apparatus, and, more particularly, to apparatus for measuring characteristics such as the capacitance of chip type capacitors and insulation resistance thereof and for packing them into tapes or cases.

2. Description of the Prior Art

Typically, capacitors are subjected before delivery or "ship-out" to measurement of the electrostatic capacitance and insulation resistance (IR) thereof for selecting acceptable capacitors from among those under test, while screening out any defective ones based on the resultant measurement values thereof. This selection or screening process requires efficient handling of a great number of capacitors. To attain this object, certain characteristics measurement apparatus has been known which is disclosed in Published Unexamined Japanese Patent Application No. 4-254769, wherein the apparatus is designed to make use of a disk-shaped turn table having along its outer periphery multiple holder sections each of which holds a single capacitor at a time during intermittent rotation of the turntable for sequential effectuation of the measurement processes required.

Unfortunately, the prior known characteristics measurement apparatus of this type is associated with a problem: much time is required to complete the IR measurement. More specifically, since it is necessary in the prior art IR measurement scheme to measure a charge current under the condition that a capacitor is fully charged, approximately sixty (60) seconds of measurement time duration has been required for each IR measurement. For this reason extra time-consuming tasks have been necessary including reserving most of the turntable periphery for use as a charge region, and interrupting the operation of the turntable to complete a charging process in a certain time period, which results in a decrease in work efficiency. In addition, there is a need to put a predetermined number of acceptable capacitors into a storage member, such as a take-out vessel, and then take every capacitor out of the vessel by use of a parts feeder or the like in a one-by-one manner in order to supply them to an associative taping device or the like, which, in turn, leads to a significant decrease in the overall speed of work, measurement and packing operations, while simultaneously increasing the scale of facility and production costs.

SUMMARY OF THE INVENTION

It is therefore an object of the present invention to provide capacitor characteristics measurement/packing apparatus capable of improving the working efficiency while reducing facility size and cost, by letting characteristics measurement apparatus and packing apparatus cooperate with each other.

To attain the foregoing and other objects, the present invention is directed to a capacitor characteristics measuring and packing apparatus which includes transport means driven in a predefined direction and having holders provided at equal intervals for holding respective capacitors therein, supply means provided adjacent to the transport means for sending and supplying capacitors to the holders of the transport means, quality discriminating means provided on a movement locus at the holders of the transport means for applying a DC voltage to a capacitor held by one of the holders and discriminating the quality of the held capacitor from charge characteristics of the capacitor at an initial charge period, an acceptable product extraction section provided adjacent to the transport means for ejecting from the holder section of the transport means a capacitor determined to be acceptable at the quality discriminating means, a defective product ejection section provided adjacent to the transport means for ejecting from the holder section of the transport means a capacitor determined to be defective at the quality discriminating section and packing means disposed corresponding to the acceptable product extraction section for packing those acceptable capacitors.

Capacitors supplied to the holders of the transport means by the supply means pass through the quality discriminating means upon the driving of the transport means and the quality thereof is discriminated. As a method of discriminating the quality of the capacitor there may be a method in which a current value in a charge region at a dielectric polarization component of a capacitor and the quality of the capacitor is discriminated from this predicted value. Also, there may be a method in which a standard selection value charge characteristic of the dielectric polarization component of the capacitor is set beforehand and the quality of the capacitor is discriminated by comparing the actual measured current value characteristic of the dielectric polarization component of the capacitor and the standard selection value charge characteristic. Since a current value at a charge termination period is measured in the prior art, much time is required. According to the present invention, however, since a method for predicting a current value or a charge characteristic in an initial charge period is used, measurement can be performed in a significantly short period. The quality of the capacitor is discriminated by a predicted IR value or by comparing the actual measured current value characteristic and the standard selection value current characteristic. The capacitors determined as defective product are ejected from the defective product ejection section and the capacitors determined as acceptable product are supplied from the acceptable product extraction section to the packing means and packed in cases or tapes here.

As an IR prediction section for predicting the current value in a charge termination period by using the current value in an initial charge period of the dielectric polarization component, for example, a method may be used comprising the steps of: initial setting a current calculation formula using an equivalent circuit of the capacitor, modifying the current calculation formula using an equivalent circuit of the capacitor, modifying the current calculation formula by determining the capacitances C1, C2, . . . Cn and the resistances R1, R2, . . . Rn which are dielectric polarization component of the equivalent circuit so that the actual measured current value m(t) and the calculated current value j(t) determined by the current calculation formula coincide with each other, and determining the current value in the charge termination period by using the modified calculation formula. Further, a method may be used wherein the approximation formula of the charge current characteristic of the dielectric polarization component from the plural measured current values in the initial charge period of the dielectric polarization component of the capacitor is used.

When the quality of the capacitor is discriminated, it would be preferable to discriminate by using not only the IR prediction value but also the capacitance of the capacitor. In this case, the quality discriminating means includes a capacitance measurement section and the quality discriminating section discriminates the quality of the capacitor from the measured value at the capacitance measurement section and the predicted value at the IR prediction section.

When the quality is discriminated by using a standard selection value current characteristic, the standard selection value current characteristic is set, for example, in an intermediate region between acceptable products and defective products. As a result, the quality of the capacitor can be accurately discriminated by comparing the actual measured current value characteristic of the dielectric polarization component of the capacitor to be measured and the standard selection value charge characteristic. Since the quality is discriminated by continuous data of the dielectric polarization component, more accurate quality discrimination is possible than the prior art in which the quality is discriminated by point data.

As a quality discriminating means by comparing the actual measured current value characteristic and the standard selection value current characteristic, there may be a means wherein either one of the ratio, the difference, the difference of logarithmic values, or the ratio of logarithmic values between the actual measured current value m(t) of the capacitor and the standard selection value charge characteristic is defined as an evaluation function n(t), wherein said means includes a means for quadratic curve approximating this evaluation function and a means for discriminating the quality of the capacitor depending on whether the secondary coefficient of the quadratic curve approximation formula is negative or positive.

By using the method above, the quality discrimination can be performed accurately in a quite short period, that is, several tens of m seconds after the application of voltage. Further, by using a quadratic curve approximation, since the general tendency of the changes of the evaluation function n(t) can be attained, stable quality discrimination can be performed.

The transport means may be a turn table having holders for holding capacitors along the outer circular periphery at equal pitch intervals or an endless belt with holders for holding capacitors at equal pitch intervals. In the prior art, since much time was required for IR measurement, a large-sized turn table had to be used. However, according to the present invention, the measurement may be performed by using a small-sized turn table. Holders may be recessed portions for containing the capacitors or air attraction holes for attracting and holding the capacitors. When air attraction is performed, it is not necessary to provide recessed portions.

Further, the packing means may be taping means for housing an acceptable capacitor taken out of the acceptable product extraction section into a storage section of a base material tape, and for thereafter pasting a cover tape onto the base material tape. Also, the packing means may be case-packing means for string in a case a group of a predetermined number of acceptable capacitors as taken out of the acceptable product extraction section.

DETAILED DESCRIPTION OF THE INVENTION

Figure 1:
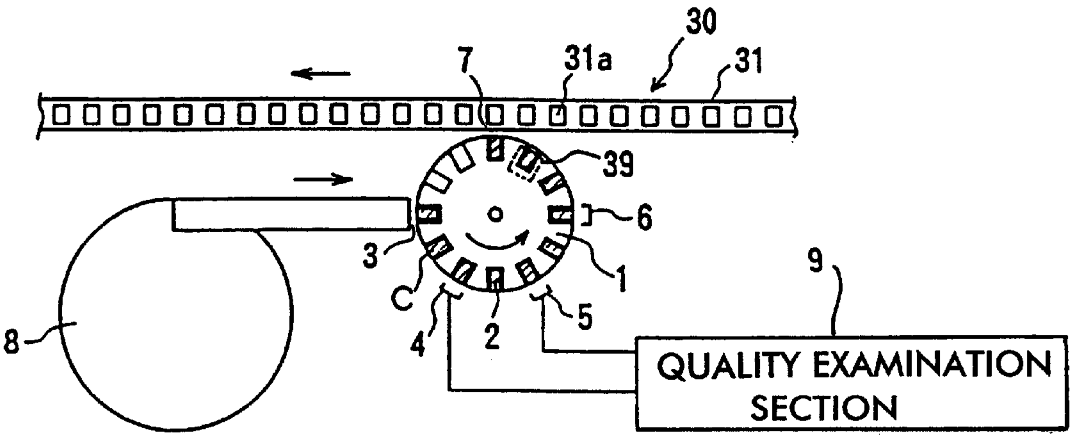
FIG. 1 is a diagram schematically showing a plan view of a first embodiment of the capacitor characteristics measurement/packing apparatus in accordance with the present invention.

FIG. 1 shows a first embodiment of a characteristics measurement/packing apparatus employing the method of the present invention.

Figure 2:
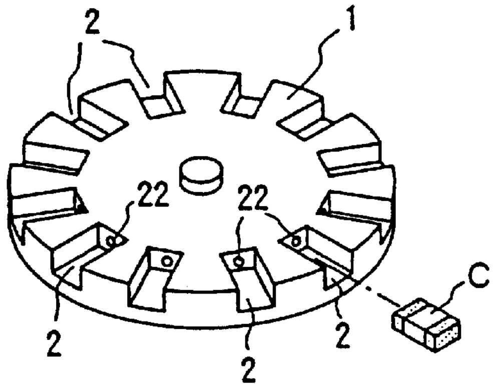
FIG. 2 is a diagram showing a perspective view of a turntable used.

Reference numeral 1 designates a turn table; the turntable 1 is driven to intermittently rotate in essentially uniform angular movements or constant pitch distances in the direction indicated by an arrow. As shown in FIG. 2, rectangular recess-shaped holder sections 2 are provided along the outer periphery of the turntable 1 with the same pitch intervals as the rotation drive pitch. These holders are capable of holding or storing chip type capacitors C in a one-by-one manner. Provided around the turntable 1 are several associative components including a supply section 3 for supplying or feeding capacitors C to the turntable 1, a capacitance measurement section 4 for measuring the electrostatic capacitance, an insulation resistance (IR) prediction section 5, a defective product ejection section 6, an acceptable product extraction section 7 and the like. A supply device 8 is disposed at a specified position corresponding to the supply section 3, which device may include a parts feeder or the like for transferring the capacitors C to the turntable 1 at a time. Respective measurement values obtainable from the capacitance measurement section 4 and IR prediction section 5 are sent to a quality examination/check section 9, which uses the measurement values to determine whether a capacitor C under test is acceptable or rejectionable—i.e. good or bad in product quality. Any capacitors C judged to be bad or defective are ejected to the outside at the defective product ejection section 6, whereas those capacitors C judged as good products are then taken out of the acceptable product extraction section 7 onto a base material tape 31.

It should be noted that while in FIG. 1 the IR prediction section 5 consists of a single block only, this section may alternatively be designed to have a plurality of blocks.

Figure 3:
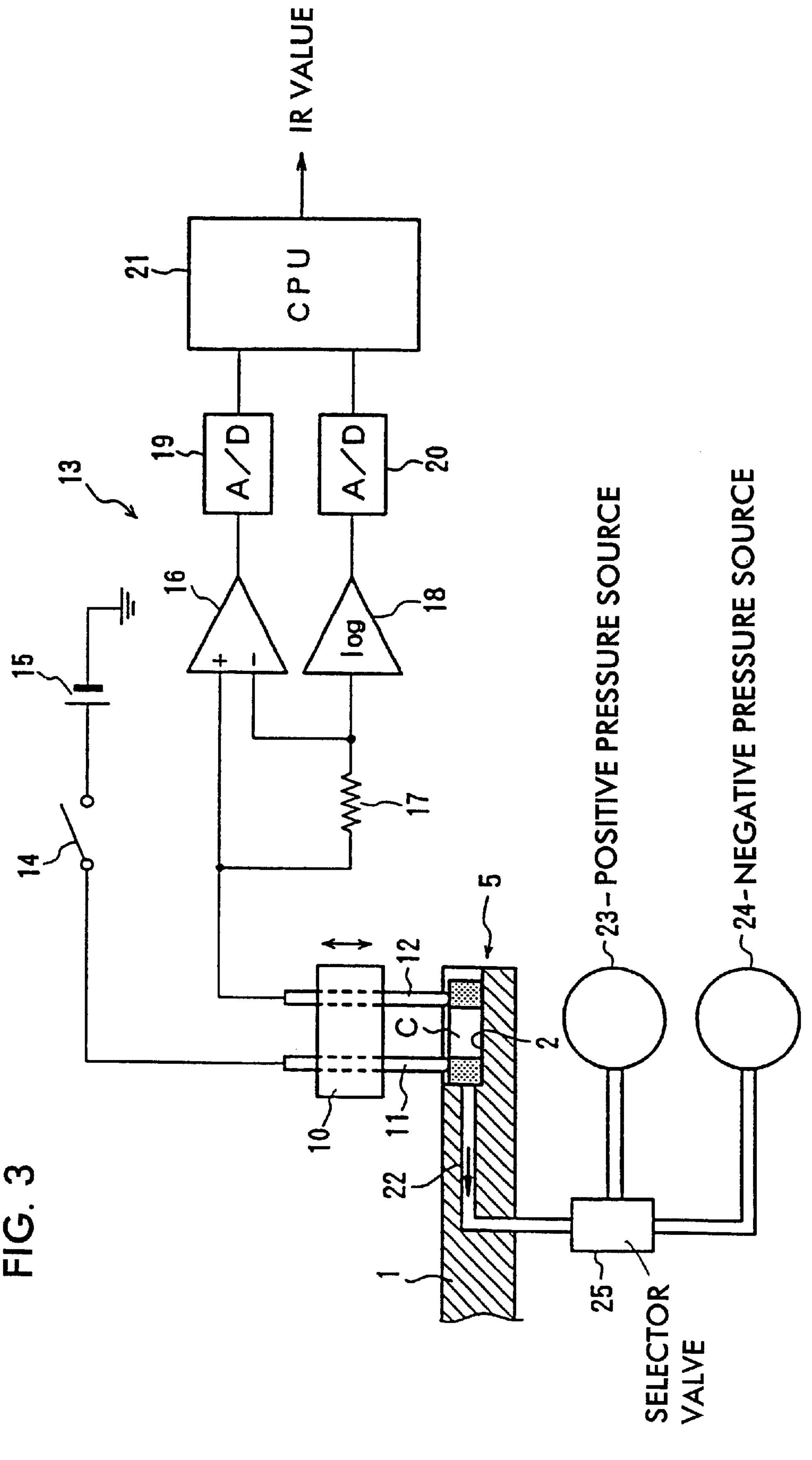
FIG. 3 is a diagram showing an IR prediction section and a measurement circuit operatively associated therewith.

FIG. 3 illustrates a configuration of the IR prediction section 5. As shown, the IR prediction section 5 is generally constituted from an up/down liftable or "elevatable" terminal base plate 10, a pair of measurement terminals 11 and 12 attached to this terminal base 10, and a measurement circuit 13 connected to these measurement terminals 11, 12. When a certain capacitor C as held at one holder section 2 arrives at a predefined location immediately beneath the terminal base 10, the terminal base 10 moves downwardly causing the measurement terminals 11, 12 to be in contact with two electrodes of the capacitor C. Note here that although the capacitance measurement section 4 is not shown in the drawing, this unit may be designed to have its terminal base plate and associative measurement terminals which are similar to those in the IR prediction section 5 discussed above.

The measurement circuit 13 includes a DC power supply 15 connected through a switch 14 to one measurement terminal 11. The remaining measurement terminal 12 is connected to the positive input of a measurement amplifier 16, and is also connected via a limit resistor 17 to both the input of a logarithmic amplifier 18 and the negative input of the measurement amplifier 16. The output of such measurement amplifier 16 and the output of logarithmic amplifier 18 are connected to an arithmetic processor circuit (CPU) 21 via analog-to digital (A/D) converters 19, 20 respectively. The CPU 21 provides control for permitting measurement of a charge current at the measurement amplifier 16, switching to the logarithmic amplifier 18 at a predetermined threshold value, and thereafter performing measurement of the charge current at the logarithmic amplifier 18. This measurement circuit 13 is capable of effectuating accurate measurement even where the charge current of capacitors C varies in a wide range, and is thus featured in that it may accurately and continuously measure the charge current value in an extended period from the charge initial period to charge termination period, which have been difficult to be measured in the prior art measurement apparatus.

It should be noted that in the present invention the measurement circuit 13 does not measure a current value at the charge termination period (approximately sixty seconds after) of a capacitor C, but only measure a current value at the charge initiation period (for example, one millisecond to ten milliseconds) of one or more dielectric polarization components of such capacitor C while predicting the current value at the charge termination period. The principle thereof will be described in detail later.

As shown in FIG. 3, the turntable 1 is provided with air flow holes 22 corresponding to respective holder sections 2. Each air hole 22 is coupled to a positive pressure source 23 and negative pressure source 24 via an electromagnetic switch valve or "selector" 25. The selector valve 25 is responsive to receipt of a command signal from the quality check section 9 (FIG. 1) for causing one of the positive pressure source 23 and negative pressure source 24 to be selectively coupled to the air hole 22. In a certain time period in which a capacitor C is held in the holder section 2, the air hole 22 is coupled to the negative pressure source 24 letting the capacitor C be tightly held by suction force on the inner surface of such holder section 2. This ensures that the measurement terminals 11, 12 are brought into contact with the capacitor C at constant locations thereon, thus enabling execution of reliable measurement of characteristics thereof while at the same time making it possible to eliminate occurrence of any accidental dropping of the capacitor C due to application of the centrifugal force resulting from rotation of the turntable 1. On the other hand, when a defective capacitor C reaches the defective product ejection section 6 (FIG. 1), the switch valve 25 is changed over to the positive pressure source 23 causing it to blow or output air against the capacitor C for outward ejection thereof. In a similar way, when an acceptable or good capacitor C reaches the acceptable product extraction section 7 (FIG. 1), the switch valve 25 is switched to the positive pressure source 23 letting the capacitor C stored in the holder section 2 be pushed out onto a base material tape 31 as will be described later.

Figure 4:
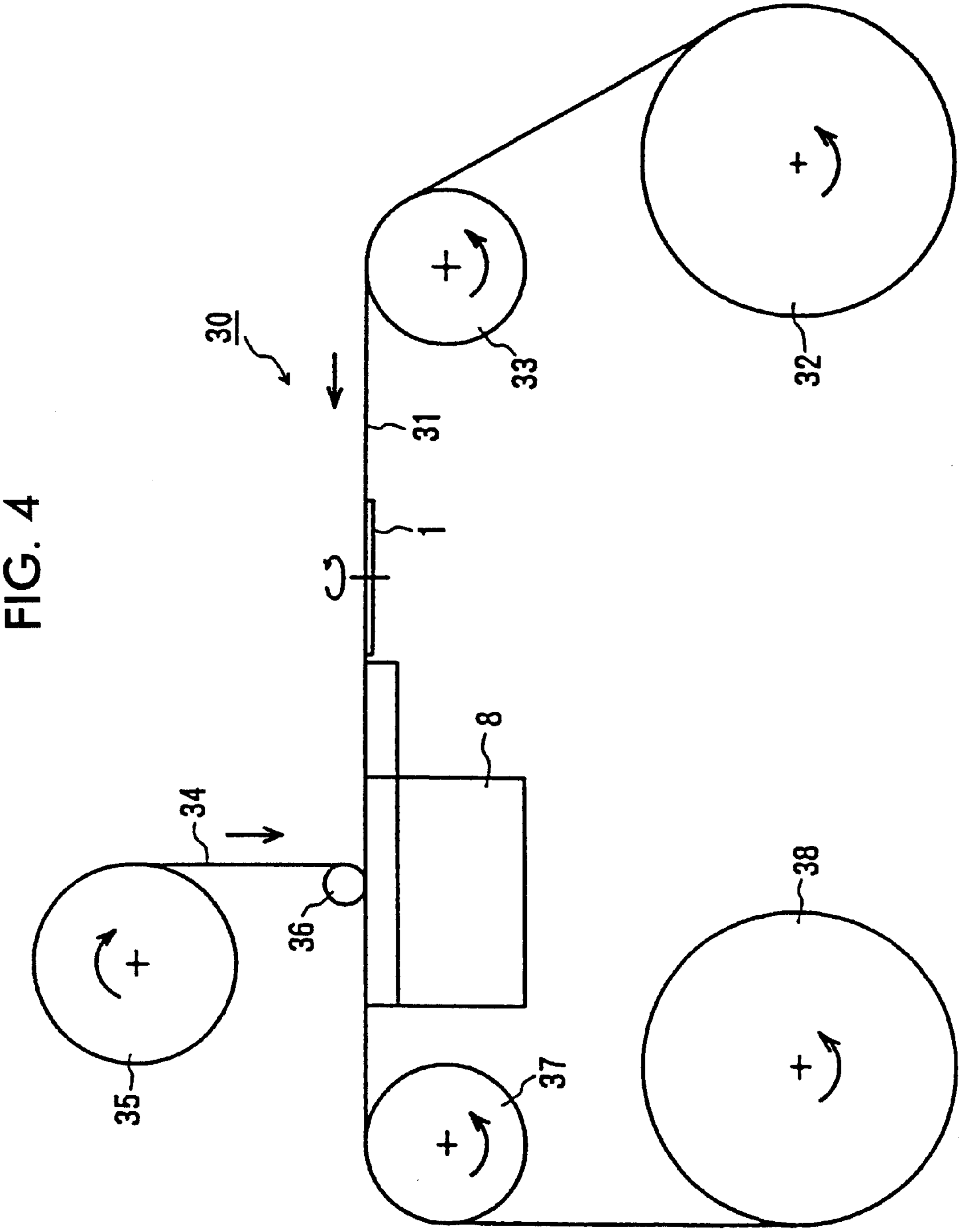
FIG. 4 is a side view of a taping device employed.
Figure 5:
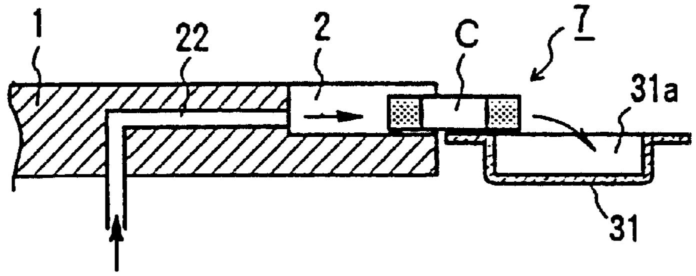
FIG. 5 is a sectional view of an acceptable product extraction section.

As shown in FIG. 1, at a specific location corresponding to the acceptable product extraction section 7, a taping device 30 is disposed for supplying the base material tape 31 in a way such that the tape runs at the same height as that of the holder sections 2 in a preselected direction along the tangential line of the turntable 1. As shown in FIG. 4, the taping device 30 includes a supply roll 32 which supplies the base material tape 31 having several recesses 31a (FIG. 5) for storage of capacitors, a guide roller 33 that guides the base tape 31 during travel thereof, a supply roll 35 for supplying a cover tape 34, a compressive roll 36 for adhering or pasting by compression the cover tape 34 on the base tape 31, a guide roller 37 for guiding the resulting adhered tapes 31, 34, a reel-up roller 38 for reeling up the adhered tapes 31, 34, and others. The reelup roller 38 is intermittently driven by a drive means not shown herein so that it travels in short and uniform movements each equal to one specified pitch along the direction designated by an arrow in such a way that this drive timing is synchronized with the driving timing of turntable 1. With such an arrangement, whenever the holder section 2 of the turntable 1 stops at the acceptable product extraction section 7, the base tape 31 also stops simultaneously at the acceptable product extraction section 7. And, blowing of air from the air hole 22 provided in the turntable 1 as shown in FIG. 5 forces a capacitor C stored in its corresponding holder section 2 to be pushed out onto the base tape 31 for storage in one recess portion 31*a*. After the capacitor C is put into the recess portion 31*a*, the cover tape 34 is pasted on the base tape 31 for air-tight sealing of the recess portion 31*a*.

In cases where a defective capacitor C is ejected at the defective product ejection section 6, its corresponding holder section 2 becomes empty. Accordingly, if the turntable 1 is driven so that it is always synchronized with the taping device 30, it is possible that the cover tape 34 will be pasted over a recess portion 31*a* in the absence of any capacitor therein. To avoid this problem, a sensor 39 (see FIG. 1) is provided immediately prior to the acceptable product extraction section 7 for detection of whether a capacitor C is present or absent within the holder section 2. Whenever this sensor 39 detects the absence of a capacitor C in the holder section 2, the taping device 30 is temporarily stopped causing the turntable 1 to continue turning around to thereby ensure that every capacitor C is reliably stored in the individual one of all the recess portions 31*a* of the base tape 31 without exception.

According to the apparatus embodying the present invention, it is possible to obtain the current at the chargeup termination of a capacitor C—that is, the insulation resistance thereof—within a shortened time period, which, in turn, makes it possible to complete an insulation resistance measurement within a period of one or several stoppage events of the turntable 1 thereby enabling the IR prediction section 5 to be comprised of one or a few blocks. For this reason, it becomes possible to provide successful cooperation of the turntable 1 and the taping device 30 together, which in turn enables characteristics measurement-completed capacitors C to be directly transferred from the turntable 1 to the taping device 30. As a result, it is possible to almost completely automate operations from the characteristics measurement to packing process, which, in turn, leads to the capability of remarkably improving the task completion speed as compared to the prior art while simultaneously reducing facility size and production cost.

Figure 6A:
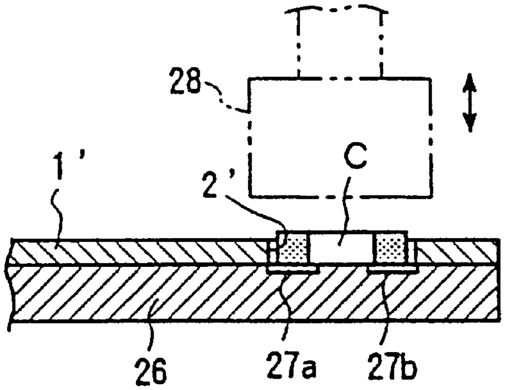
FIG. 6 is a sectional view of another embodiment of the turntable.

The turntable 1 should not exclusively be limited to the structure shown in FIG. 2 and may alternatively be designed to employ either one of structures shown in FIG. 6. First, referring to FIG. 6(A), a turntable 1' has its outer periphery along which holder holes 2' for engagement with capacitors C are formed with a constant pitch distance defined between adjacent ones thereof. The turntable 1' has a lower surface which is slidably supported by a support plate 26 that is fixed at a predefined location. The support plate 26 has its surface on which a pair of electrodes 27*a*, 27*b* connected to measurement circuits, respectively, are provided at surface locations corresponding to the capacitance measurement section 4 and the IR measurement section 5. These electrodes 27*a*, 27*b* are brought into contact with electrodes of a capacitor C under measurement to thereby enable intended measurement of capacitor characteristics. Optionally, an insulative resilient body 28 may be disposed for elastically pressing the capacitor C from its upper side thereof during measurement in order to increase contact reliability of the electrodes 27*a*, 27*b* with the electrodes of capacitor C.

Figure 6B:
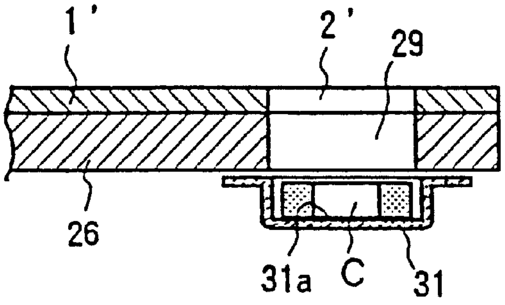

Referring next to FIG. 6(B), a though-hole 29 is formed in the support plate 26 at a location corresponding to the acceptable product extraction section 7 while causing the base tape 31 to be supplied in such a way that the recess portion 31*a* corresponds to the lower part of this through-hole 29. Accordingly, when the holder hole 2' of the turntable 1' corresponds in position to the base tape 31, the capacitor C behaves to naturally drop down due to the self weight so that it will be automatically be stored into the recess portion 31*a* of base tape 31.

Note that a similar through-hole (not depicted herein) is also formed in the support plate 26 at another location corresponding to the defective product ejection section 6 allowing a capacitor C to drop down due to the self weight for ejection whenever the holder hole 2' of the turntable 1' positionally corresponds to this through-hole. Also, in order to prevent any defective capacitor from attempting to drop down at the acceptable product ejection section 7 and prevent an acceptable product from dropping down at the defective product ejection section 6, the turntable 1' may be provided with an air hole similar to that shown in FIG. 5 at the holder hole 2' thereof thus permitting reliable suctional support of a capacitor C using this air hole.

First Embodiment of the Quality Discriminating Method

Figure 7:
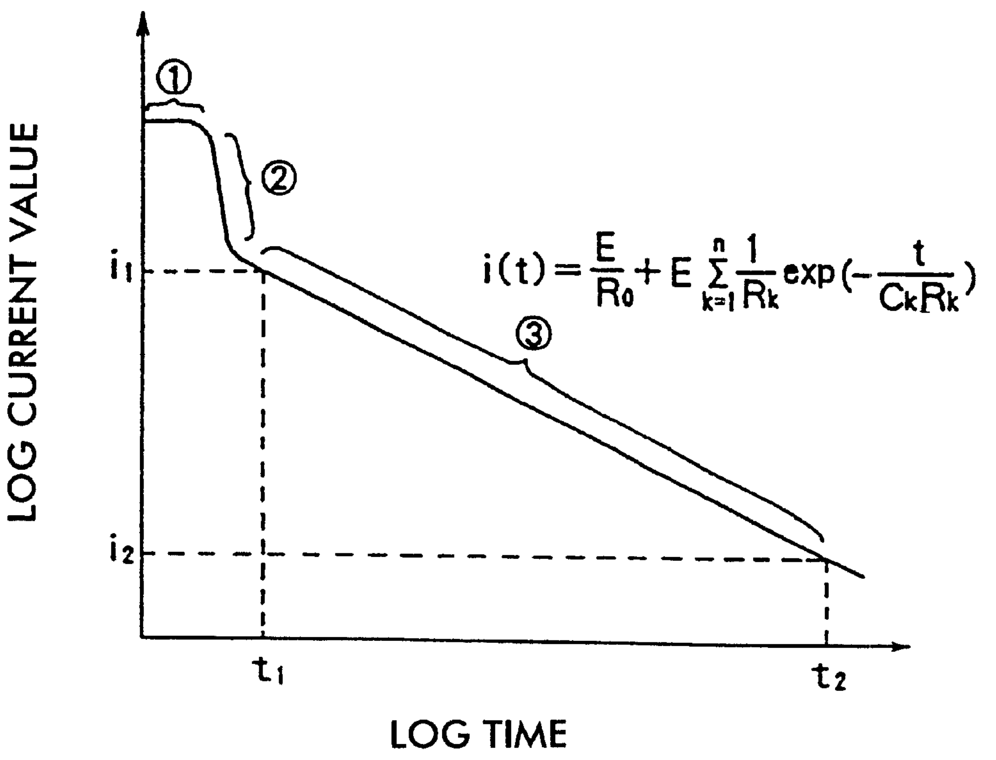
FIG. 7 is a diagram showing a change in charge current of a capacitor.

An explanation will next be given of the principle of a method for prediction of the charge current at the IR prediction section 5. See FIG. 7, which is a graph plotting in the logarithmic coordinate system a charge current versus time characteristic of a ceramic capacitor as obtained by the measurement circuit 13. More specifically, a large current of almost constant magnitude tends to flow in a minute period (1) at the beginning of a chargeup operation; however, within its succeeding transition period (2), the current value rapidly decreases, and thereafter, the current tends to decrease while exhibiting a linear charge characteristic (3) with a certain inclination or "gradient." This linear charge characteristic (3) continuously resides during a time period ranging from the initiation of chargeup to a time point of one or two minutes later.

Figure 8:
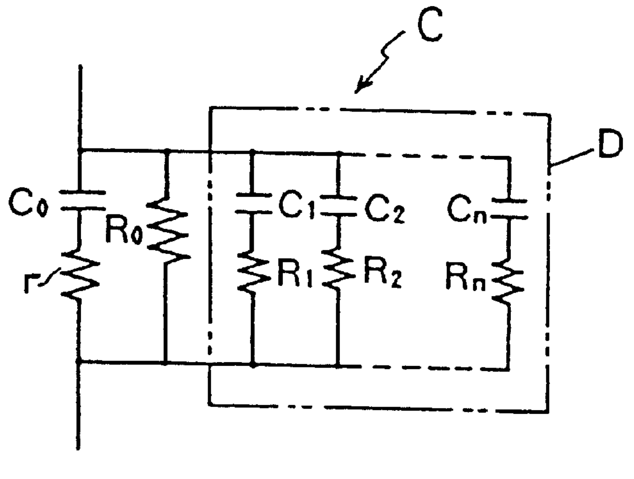
FIG. 8 is a diagram showing an equivalent circuit of a capacitor.

FIG. 8 shows an equivalent circuit of a capacitor C. In FIG. 8, $C_0$ represents the capacitance, r denotes the equivalent series resistance, $R_0$ indicates the insulation resistance, and D is the dielectric polarization component of capacitor C. In the charging characteristic shown in FIG. 7, the initial charging characteristic (1) is the charge region of the capacitance $C_0$ whereas the linear charging characteristic (3) is the charge region of dielectric polarization component D.

It is thus possible to predict a current value $i_2$ in the chargeup termination period by obtaining from the equivalent circuit of capacitor C a current calculation equation in the charge region (3) of the dielectric polarization component D, then actually measuring a current value $m(t_1)$ at the beginning (for instance, at time point $t_1$ of FIG. 7) of the charge region (3) of dielectric polarization component D, next modifying or correcting the current calculation equation so that the resulting measured current value $m(t_1)$ is identical to its corresponding calculated current value $i(t_1)$ as calculated using the equivalent circuit, and finally substituting into the modified current calculation equation a time point $t_2$ of the charge termination period (sixty second later, for example).

Additionally, the initial period (1) can vary in length with a change in capacitance value of a capacitor under measurement; typically, the sum of the initial period (1) and the transition period (2) may be less than or equal to 10 milliseconds. Accordingly, measuring as the actually measured current value $m(t_1)$ a current value at a time point elapsed by 10 milliseconds, or more or less, from the initiation of charging operation may result in accurate definition of the current calculation equation required, which, in turn, enables accurate prediction of the final current value $i_2$.

Next, one practically embodied prediction method will be explained. First of all, capacitance values $C_1, C_2, \ldots, C_n$ and resistance values $R_1, R_2, \ldots, R_n$ which constitute the dielectric polarization component D are put in specific geometric progression relations which follow:

$$C_k=p^{k-1}C_1,\ R_k=q^{k-1}R_1 \qquad \text{Equation (1)}$$

where k=1, 2, . . . , n; $C_1$, $R_1$, p and q are constants.

In this case the equation i(t) of a current flowing in the equivalent circuit will be defined as:

$$i(t)=\frac{E}{R_0}+E\sum_{k=1}^{n}\frac{1}{R_k}\exp\left(-\frac{t}{C_kR_k}\right) \qquad \text{Equation (2)}$$

where, E is the voltage applied to a capacitor, t is the time, and $R_0$ is the insulation resistance.

In Equation (2) the first term represents a current flowing through the insulation resistance part $R_0$ whereas the second term indicates a current flowing in the dielectric polarization component D. Note here that while some current might flow also in a series circuit of the capacitance part $C_0$ and equivalent series resistor r at the beginning of chargeup operation, such current is withdrawn from consideration because of the fact that such does not affect directly the current calculation equation in accordance with the present invention.

The parameters $C_1$, $R_1$, p and q are then determined to guarantee that the calculation current value i(t) as has been set in the way stated supra is substantially equal to the current value m(t) as actually measured by the measurement circuit 13 of FIG. 3.

The degree of coincidence between the calculated current value i(t) and the actually measured current value m(t) is then evaluated in a way which follows. First, set an evaluation function n(t) as follows:

$$n(t)=\log(m(t))-\log(i(t)) \quad \text{Equation (3)}$$

Then, let the resultant evaluation function n(t) from Equation (3) be subject to linear approximation. An equation of approximation employed here may be a linear expression of y=ax+b; the closer to zero the gradient "a" and intercept "b," the higher the coincidence degree under judgment. Suppose that an evaluation time point "t" is at the beginning (5 m sec to 80 m sec by way of example) of the charge region (3) of dielectric polarization component D in FIG. 7.

This period differs depending on whether the objective is performing coincidence evaluation at a high speed or performing coincidence evaluation at a high accuracy. The period can be selected arbitrarily in accordance with the objective.

In this way, the current value $i_2$ at the charge termination period may be obtained by modifying the calculation equation (2) using specific parameters of higher coincidence degree and then substituting the chargeup termination time point $t_2$ (60 seconds, for instance) into the resulting modified calculation equation (2).

One typical example of the method for modifying the calculation equation (2) is as follows. Firstly, using a multilayered ceramic capacitor as the capacitor under measurement, initially set the parameters $C_1$, $R_1$, p and q at specific values which follow:

$C_1=210\times10^{-12}$, $R_1=0.1\times10^{6}$, p=1.07, q=2.1.

Figure 9:
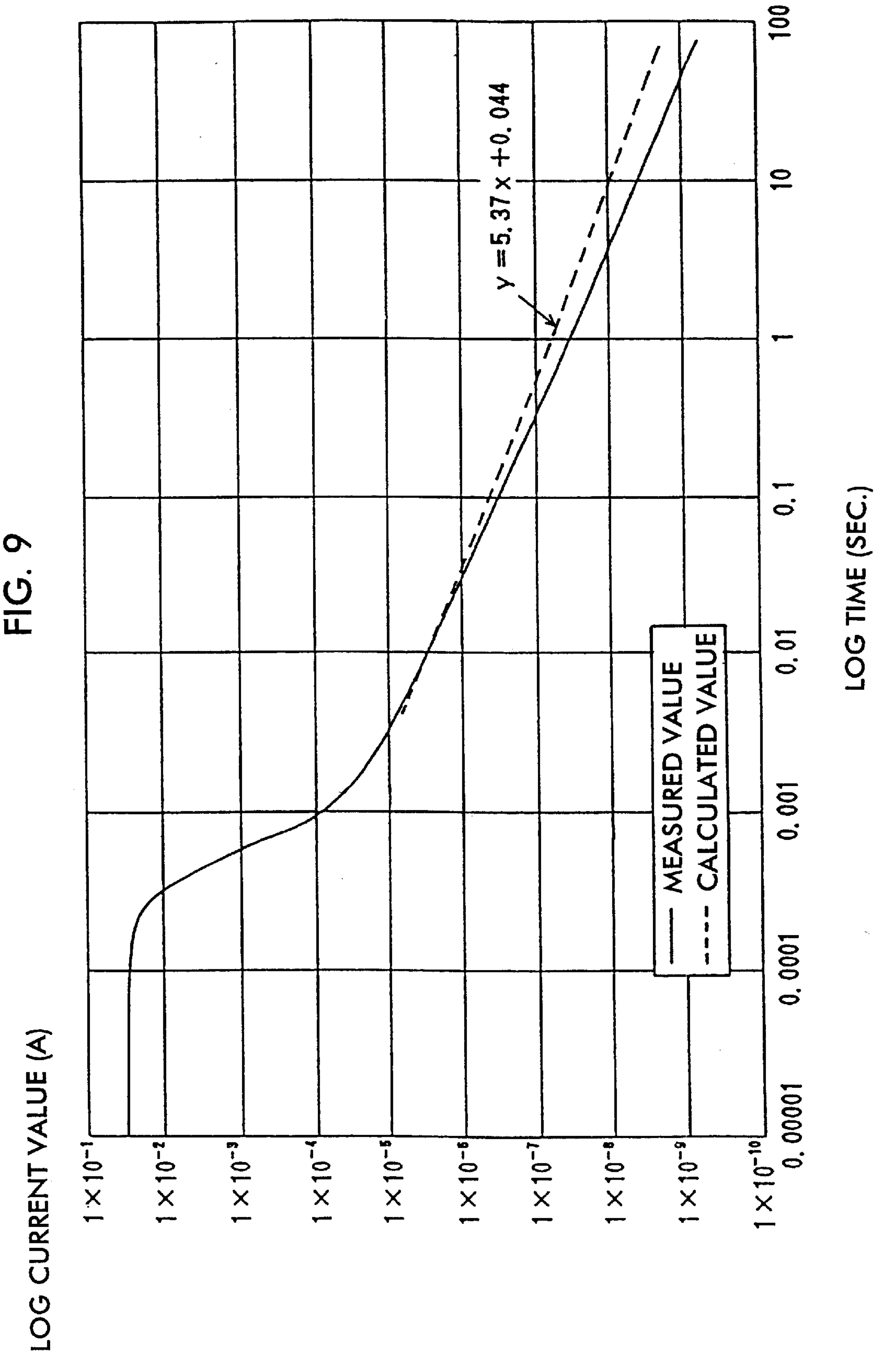
FIG. 9 is a diagram for comparison of calculated values to their corresponding actual measured values at the initial setup of the current calculation equation using the equivalent circuit.

Some calculated values i(t) obtained using such initial set values are shown in FIG. 9 along with their corresponding actually measured values m(t). The linear approximation equation obtained by the initial set of values has its gradient a=5.37 and intercept b=0.044 as indicated by an equation written in FIG. 9, both of which values are not near zero. For this reason it would be readily appreciated to those skilled in the art that one calculated value i(t) at an instant sixty seconds after is not identical to its corresponding measured value m(t).

Figure 10:
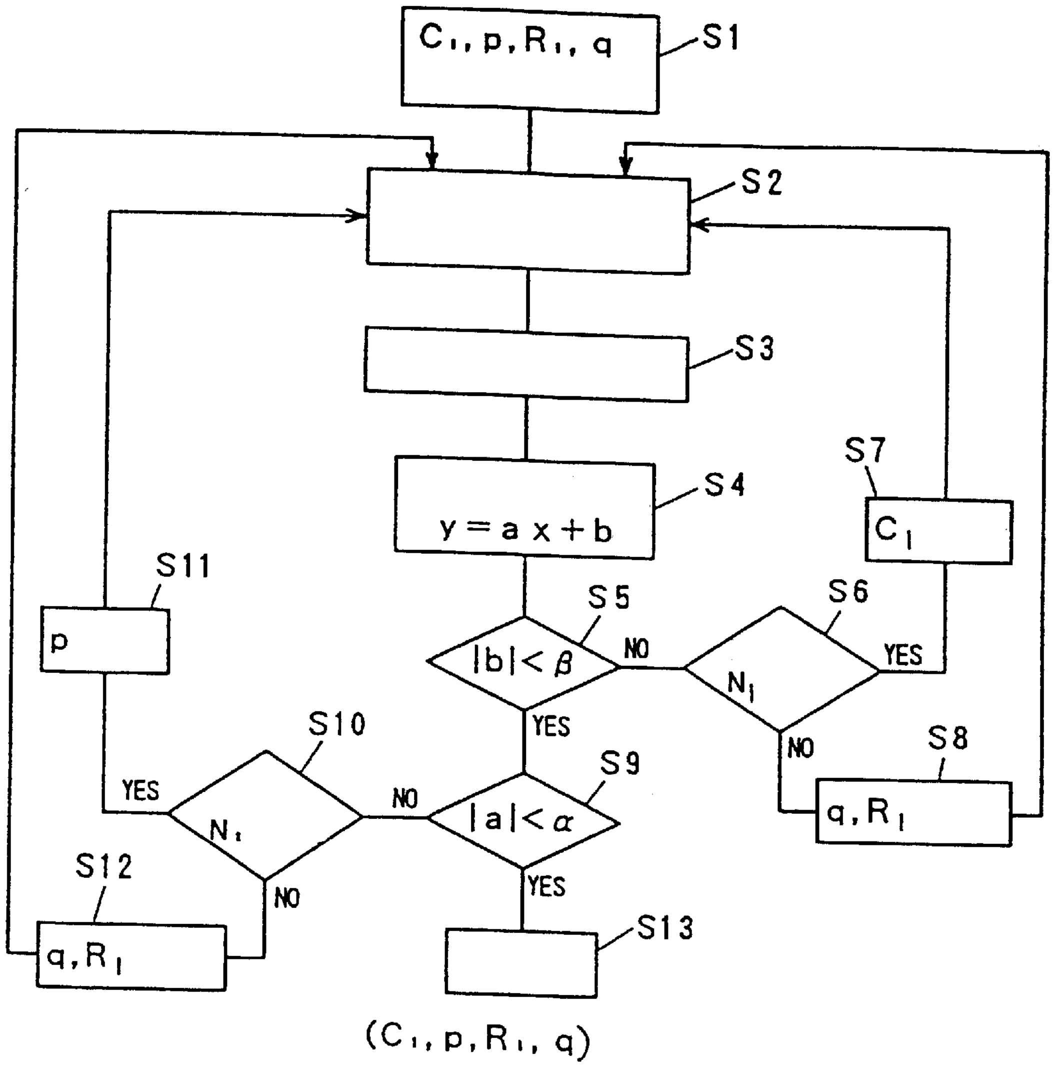
FIG. 10 is a flow chart showing a method for determining several parameters of the current calculation equation by use of the linear approximation scheme.

The next step is to modify or correct the parameters $C_1$, $R_1$, p and q by use of a method shown in FIG. 10 in a way such that the gradient "a" and intercept "b" approximate zero. First, initially set the parameters $C_1$, $R_1$, p and q (at step S1). Then, make use of such initial set parameters to obtain from the calculation equation (1) a calculated current value i(t) in the charge region (3) (for example, at or near a time point of elapse of ten milliseconds from the initiation of a chargeup operation) of the dielectric polarization component (at step S2). Subsequently, measure the actually measured value m(t) at the same time point and determine the evaluation function n(t) from equation (3) (at step S3). Next, effectuate linear approximation of the evaluation function n(t) (at step S4). Next, judge whether the absolute value of the intercept "b" of the approximation equation y=ax+b is less than a predetermined value β (β=0.01, for example) (at step S5). This step is for judging whether the intercept "b" is near zero in value.

If $|b|\geqq\beta$ at step S5, then judge whether the number of approximation calculations is within a predefined number $N_1$ (at step S6). This is a process for avoiding occurrence of any infinite loop. If the number of approximation calculations is less than or equal to $N_1$ then increment or decrement $C_1$ by a fixed value depending upon whether "b" is positive or negative in polarity (at step S7). When the approximation calculation number is greater or equal to $N_1$ which means that mere correction of $C_1$ does not let the intercept "b" come closer to zero, then increase or decrease "q" and/or "$R_1$" by a constant value depending upon whether "b" is positive or negative (at step S8).

After correcting $C_1$ at step S7 or correcting q and $R_1$ at step S8, repeatedly execute the steps S2, S3, S4 and S5. If $|b|<\beta$ at step S5 then judge whether the absolute value of the gradient "a" of the approximation equation used is less than a predefined value α (α=0.01, for example) (at step S9). If $|a|\geqq\alpha$ at step S9 then judge whether the number of approximate calculations falls within a predetermined number $N_2$ (at step S10). This is also a process for preventing any infinite loop from taking place. If the approximation calculation number is less than or equal to the number $N_2$ then increment or decrement the parameter "q" by a constant value depending upon whether "a" is positive or negative (at step S11). If the approximation calculation number is more than or equal to $N_2$ which tells that mere correction of "p" will hardly let the gradient "a" approach zero, then increase or decrease "q" and/or "$R_1$" by a constant value depending upon whether "a" is positive or negative (at step S12).

After having corrected "p" at step S11 or "q" and/or "$R_1$" at step S12, repeat the steps S2, S3, S4, S5 and S9; when $|b|<\beta$ and $|a|<\alpha$ are attained, judge that the coincidence was completed (at step S13). In other words, finally determine the parameters $C_1$, $R_1$, p and q. The finally determined parameters are as follows:

$C_1=198.3\times10^{-12}$, $R_1=0.1\times10^{6}$, p=1.093, q=2.1.

Figure 11:
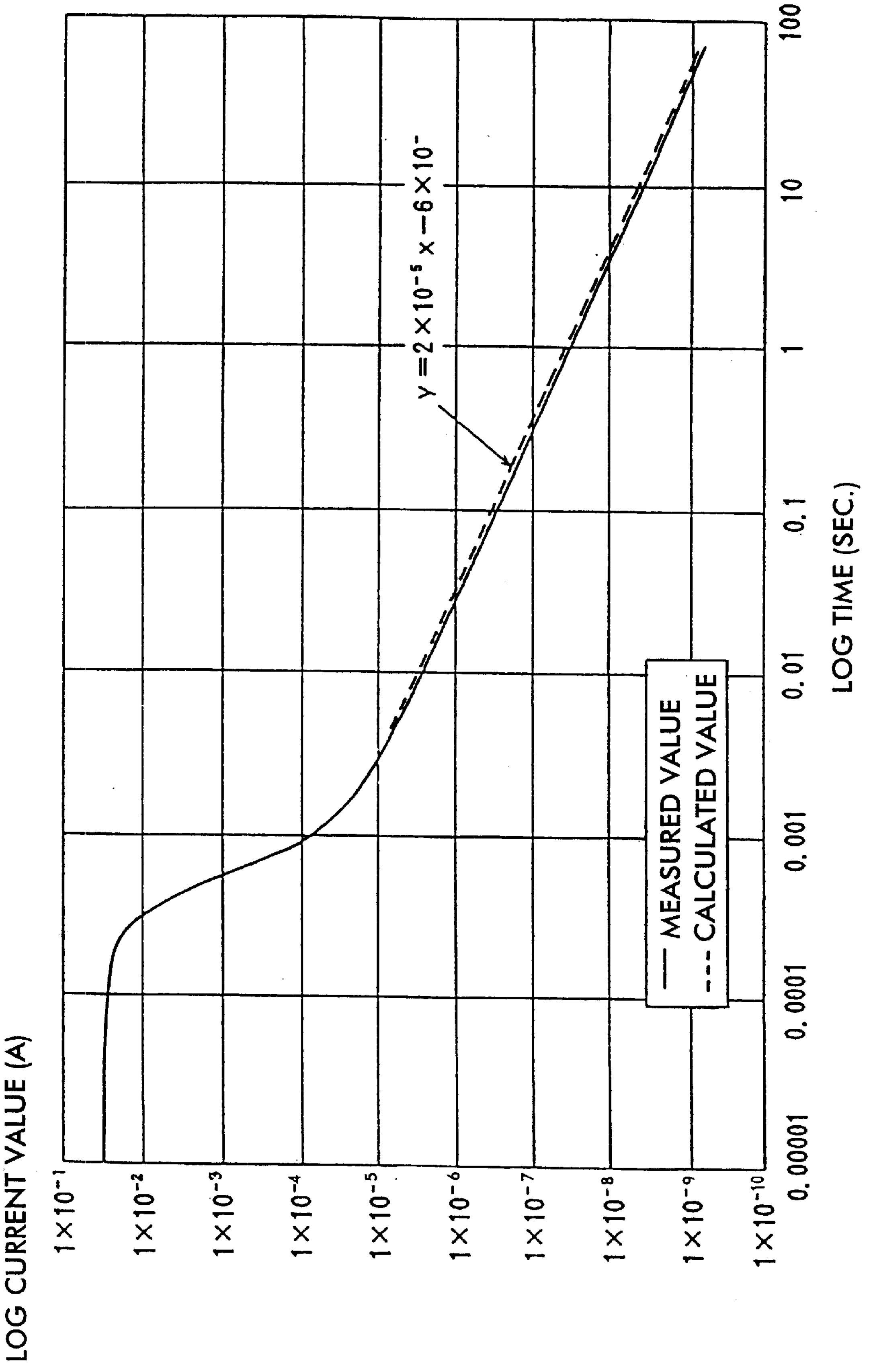
FIG. 11 is a diagram for comparing calculated values to the actual measured values obtainable after correction of the current calculation equation using the equivalent circuit.

FIG. 11 is a graph for comparison of the calculated values i(t) obtained using the corrected parameters and the measured values m(t). The linear approximation equation used in this case is such that its gradient is $a=2\times10^{-5}$ and intercept is $b=-6\times10^{-6}$, both of which values are near zero. As apparent from viewing FIG. 11, the calculated values i(t) and the actually measured values m(t) remain substantially identical to each other even at the termination of chargeup operation (60 seconds later, for example); hence, it has been proven that the foregoing prediction method is a prediction method with accuracy enhanced significantly.

Figure 12:
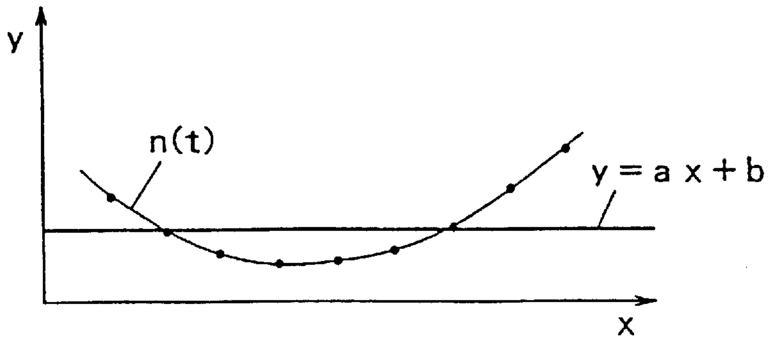
FIG. 12 is a diagram in cases where any intended approximation by the linear approximation equation is not executable.

While in the illustrative embodiment the parameters $C_1$, $R_1$, p and q are modified by the linear approximation scheme, quadratic curve approximation schemes may also be employed for correction of the parameters $C_1$, $R_1$, p and q in addition to the linear approximation. More specifically, as shown in FIG. 12, in cases where the line y=ax+b is used for approximation with respect to an evaluation function n(t), the gradient "a" and intercept "b" are near zero in value, which indicates that the linear approximation remains high in degree of coincidence. However, the measured values are not at all identical to the approximation line. This would result in the calculated value at the termination of a chargeup operation being extremely different from its corresponding actual measured value. If this is the case, co-use of the quadratic curve approximation may enable evaluation of the degree of coincidence with increased accuracy.

In the case of executing quadratic curve approximation, the approximation equation of the evaluation function n(t) is set as $y=dx^2+ex+f$; the coincidence degree is judged to be high when the coefficient of the second order "d" becomes near zero and when the term (−e/2d) is at a value falling within a block time duration for comparison of the coincidence degree. It is desirable that this block time duration is set at 5 to 80 milliseconds. When the coincidence degree is low, the value of $R_0$ in calculation equation (2) is modified. It becomes possible to obtain calculation values of further increased accuracy by employing the procedure for obtaining the current value from calculation equation (2) using such modified parameters after correction of the parameters so as to increase the degree of coincidence between the linear approximation equation and quadratic curve approximation equation.

Figure 13:
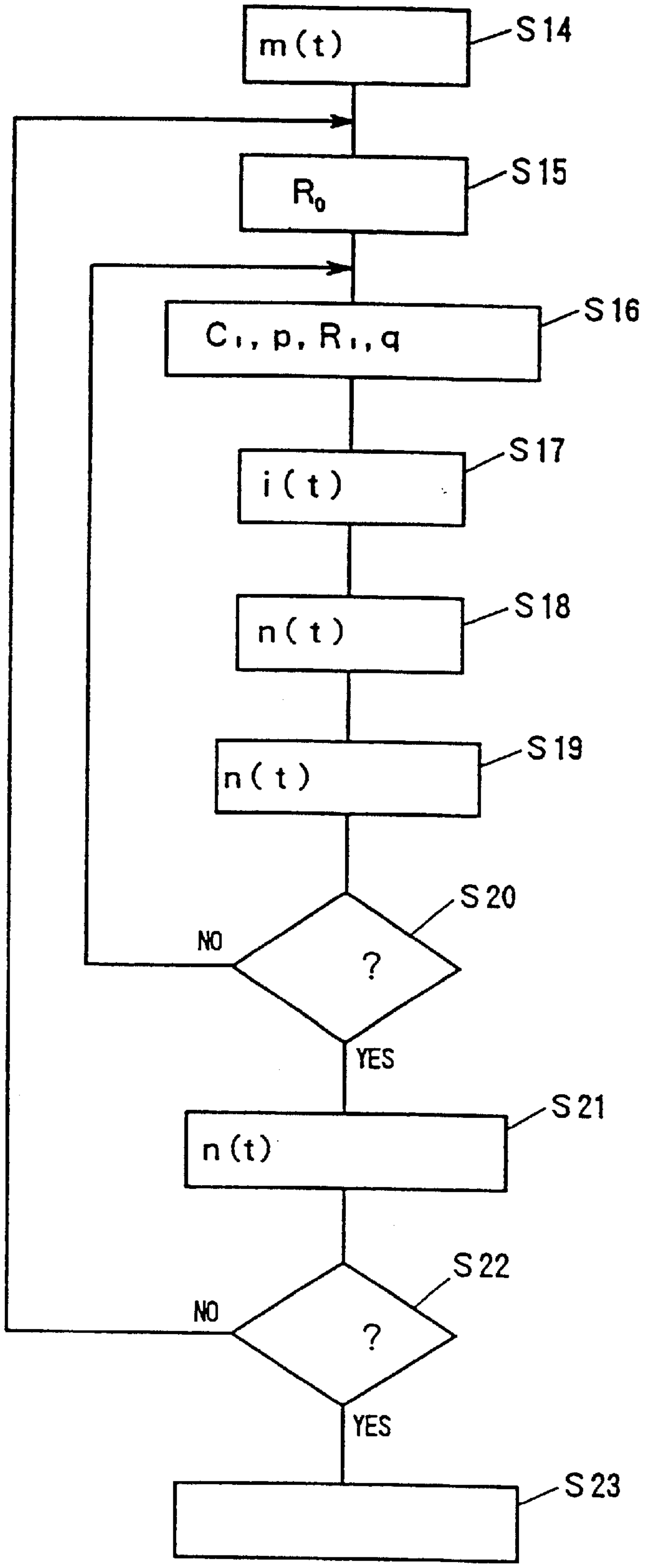
FIG. 13 is a flowchart showing a parameter determination method in the case of incorporating both the linear approximation and quadratic-curve approximation in combination.

See FIG. 13. This is a diagram showing a method for determining parameters using both the linear approximation scheme and the quadratic curve approximation scheme. First, measure a current value m(t) at the beginning (5 to 80 milliseconds after the charge started, for example) of a chargeup operation (at step S14). Then, determine the insulation resistance $R_0$. The initial value of $R_0$ is set at a sufficiently larger value than an insulation resistance of a standard capacitor to be measured ($10^{12}$ Ω, for example) (at step S15). Next, determine the parameters $C_1$, $R_1$, p and q (at step S16). The initial values of these parameters are set at empirically determined values in a manner similar to that of the step S1 of FIG. 10. Next, obtain a calculation current value i(t) from calculation equation (2) using the parameters thus determined (at step S17). Next, determine the evaluation function n(t) from equation (3) (at step S18). Next, let the resulting evaluation function n(t) be subjected to linear approximation (at step S19). Next, attempt to judge the degree of coincidence due to such linear approximation (at step S20). A judgment method used here is to make a decision based on whether the gradient "a" and intercept "b" in FIG. 10 are near zero or not. When both "a" and "b" are less than 0.01, it is judged that "a" and "b" are near zero, for example.

If the resultant coincidence degree is low then modify or correct the parameters $C_1$, $R_1$, p and q and then repeat the processes that follow the step S16. If on the other hand the coincidence degree of linear approximation is high then perform quadratic curve approximation of the evaluation function n(t) (at step S21). Subsequently, judge whether the coincidence degree due to such quadratic curve approximation is high or not (at step S22). A judgment method employed is to make a judgment based on whether the second order coefficient "d" of quadratic curve approximation equation is near zero and also whether the term (−e/2d) is at a value falling within the block time duration for comparison of the coincidence degree. If the coincidence degree is low then correct the parameter $R_0$ and thereafter repeat the procedure following the step S15. When the coincidence degree of quadratic curve approximation is judged to be high, finally determine the parameters $R_0$, $C_1$, $R_1$, p and q (at step S23).

In the above embodiment, the evaluation function n(t) is defined as the difference between the logarithm of the actual measured value m(t) and the logarithm of the calculated value i(t) as shown in equation (3). However, it is not limited to this, the linear approximation can be performed by defining the evaluation function as follows:

$$n(t)=\log m(t)/\log i(t) \qquad \text{Equation (4)}$$

$$n(t)=m(t)/i(t) \qquad \text{Equation (5)}$$

$$n(t)=m(t)-i(t) \qquad \text{Equation (6)}$$

When the evaluation function is defined as n(t)=log m(t)/log i(t) and n(t)=m(t)/i(t), the coincidence degree of linear approximation is evaluated depending on whether the gradient "a" of the linear approximation formula y=ax+b is near zero and the intercept "b" thereof is near 1 or not.

When the evaluation function is defined as n(t)=m(t)−i(t), the coincidence degree of the linear approximation can be evaluated depending on whether or not the gradient "a" is near zero and the intercept "b" is near zero.

When the evaluation function is defined as described above, in addition to the linear approximation, a quadratic curve approximation can be used.

Figure 14:
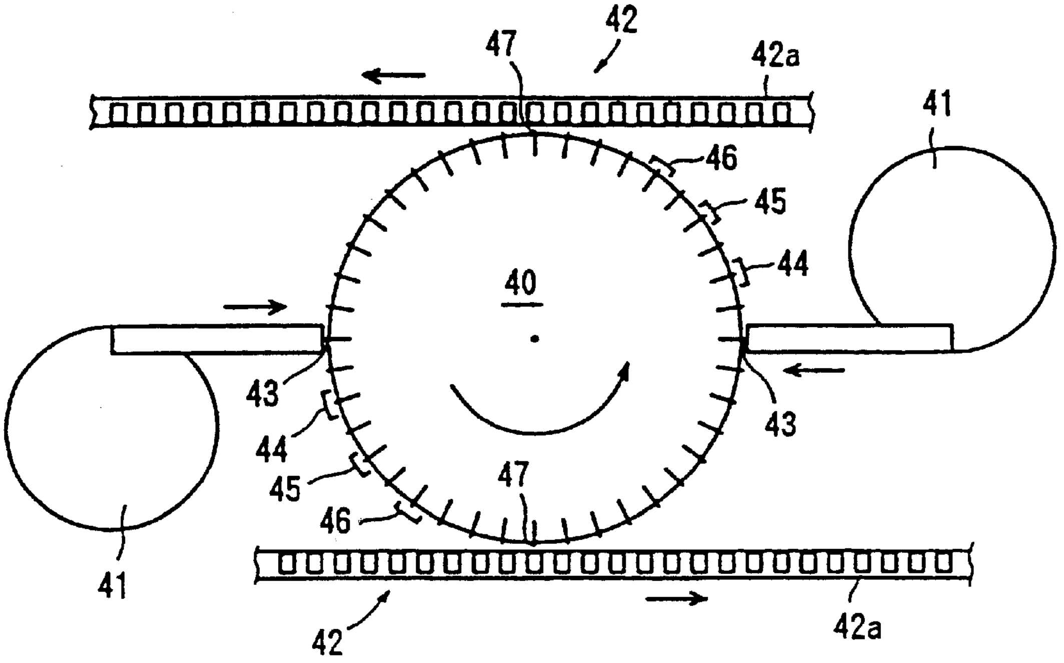
FIG. 14 is a diagram showing a plan view of a second embodiment of the characteristics measurement/packing apparatus in accordance with the present invention.

A second embodiment of the characteristics measurement/packing apparatus is shown in FIG. 14. This embodiment is such that supply devices 41 such as parts feeders are disposed on the opposite sides of a single turntable 40 which lies centrally between them while also disposing two taping devices 42 on other opposite sides of turntable 40. Additionally, reference numeral 43 designates a supply section; reference 44 denotes a capacitance measurement section for measuring the electrostatic capacitance; reference numeral 45 denotes an IR prediction section for measurement of the insulation resistance; reference numeral 46 denotes a defective product ejection section; and reference numeral 47 denotes an acceptable product extraction section. In this embodiment two tapes 42*a* are driven to travel in the reverse directions relative to each other. In the case of this apparatus, the turntable 40 increases in size as compared to the turntable 1 of FIG. 1; however, this arrangement is featured by enabling further improvement of work speed with enhanced efficiency when compared to that shown in FIG. 1 because of capability of disposing the two taping devices 42 with respect to the single turntable 40.

Figure 15:
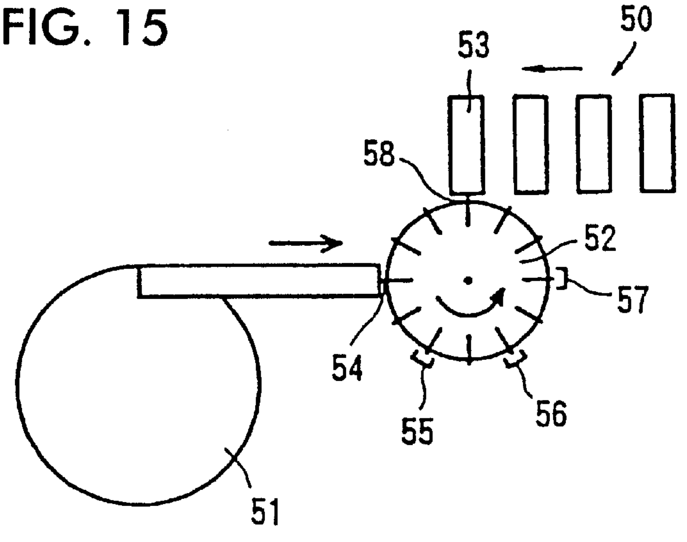
FIG. 15 is a diagram depicting a plan view of a third embodiment of the characteristics measurement/packing apparatus in accordance with the present invention.

A third embodiment of the characteristics measurement/packing apparatus is depicted in FIG. 15. This embodiment shown is arranged to employ a case-packaging device 50 as the packing device thereof. Those acceptable-product capacitors that are taken out of a parts feeder 51 by way of a turntable 52 are packed by the case-packaging device 50 into container boxes or "cases." Each case 53 is designed to store therein a predefined number of capacitors; after completion of packaging of such number of capacitors, the case is driven to travel in specified movements or steps each corresponding to a single pitch in the direction designated by an arrow. Additionally, numeral 54 designates a supply section; reference numeral 55 denotes a capacitance measurement section for measuring the electrostatic capacitance; reference numeral 56 denotes an IR prediction section for measuring the insulation resistance; reference numeral 52 denotes a defective product ejection section; and reference numeral 58 denotes an acceptable product extraction section. In this case also, similar effects to those of FIG. 1 are attainable. Note that in the case of this embodiment also, two or more case-packaging devices 50 may be provided and operatively associated with the single turntable 52 in a way similar to that of FIG. 14.

Figure 16:
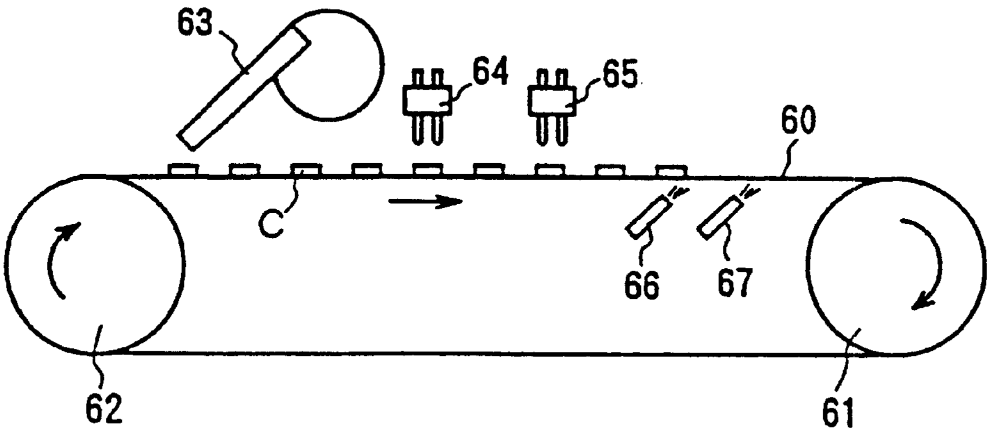
FIG. 16 is a diagram showing a plan view of a fourth embodiment of the characteristics measurement/packing apparatus in accordance with the invention.

A fourth embodiment of the characteristics measurement/packing apparatus shown in FIG. 16 is designed to use as the transport means an endless loop belt 60 as an alternative of the turntable. The belt 60 is driven continuously or intermittently by a drive pulley 61 and a guide pulley 62 in the direction represented by an arrow. A parts feeder 63 is provided at the starting end of the belt 60; "downstream" of the parts feeder 63, a capacitance measurement section 64, an IR prediction section 65, a defective product ejection section 66 and an acceptable product extraction section 67 are provided sequentially in this order.

Figure 17:
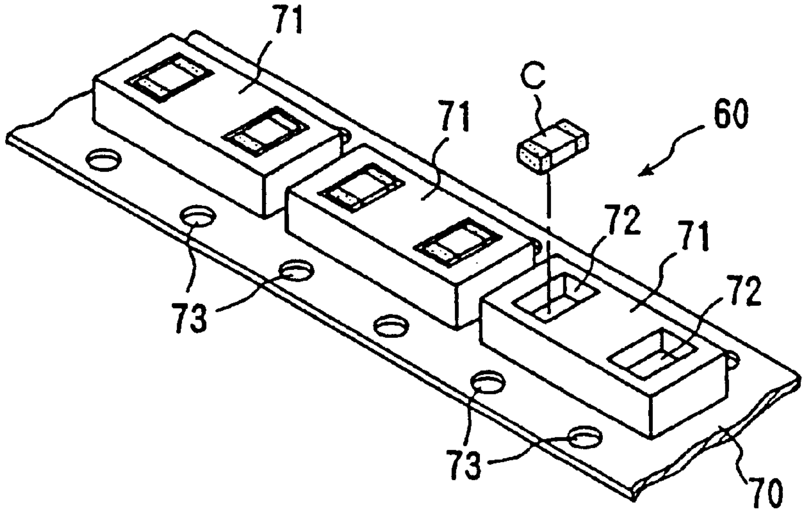
FIG. 17 is a perspective view of one example of the practical structure of a belt in accordance with the invention.

One typical structure of the belt 60 is shown in FIG. 17, in which, by way of example, a steel belt 70 has its top surface on which insulative holders 71 made of resin or rubber are mounted, each of which holders has a support opening 72 formed in its upper surface for storage of a single capacitor C therein. In this case two linear arrays of feed holes 73 are formed along the opposite side edges of the steel belt 70, each of which is engageable with a corresponding one of plurality of projections provided on the circumferential surfaces of pulleys 61, 62 for movement or transportation at high accuracy.

Figure 18:
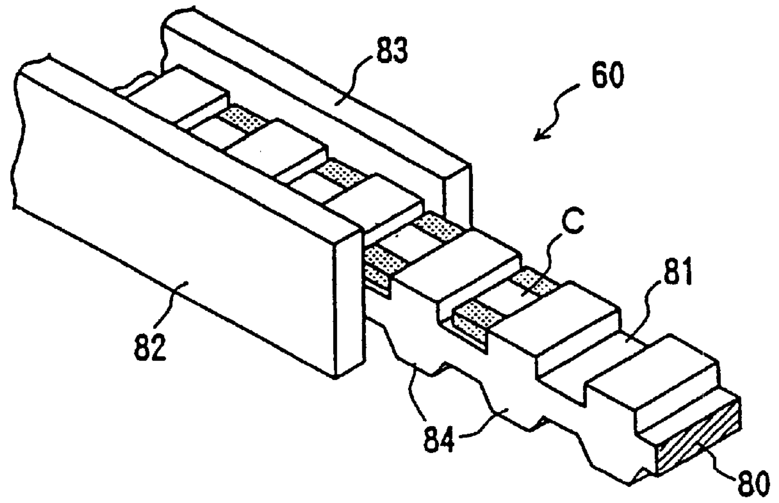
FIG. 18 is a perspective view of another example of the practical structure of a belt in accordance with the invention.

Another possible structure of the belt is shown in FIG. 18, in which a rubber belt 80 is used which has recess portions 81 provided in its outer peripheral surface at predefined constant pitch distances for permitting capacitors C to be packed into such recesses 81 in a one-by-one manner. Guide plates 82, 83 are provided on the opposite edge sides of the rubber belt 80 for slidably guiding the rubber belt while simultaneously eliminating accidental dropping of capacitors C. Rubber belt 80 has inside tooth portions 84 which are formed for engagement with the outside teeth provided on the circumferential surfaces of pulleys 61, 62 to thereby enable forward movement at high accuracy.

While the foregoing embodiments are arranged to predict a current value at termination of chargeup operation by use of the current calculation equation based on the equivalent circuit of a capacitor under measurement, the prediction of such current value in the chargeup termination period may alternatively be attained using an approximation equation.

Figure 19:
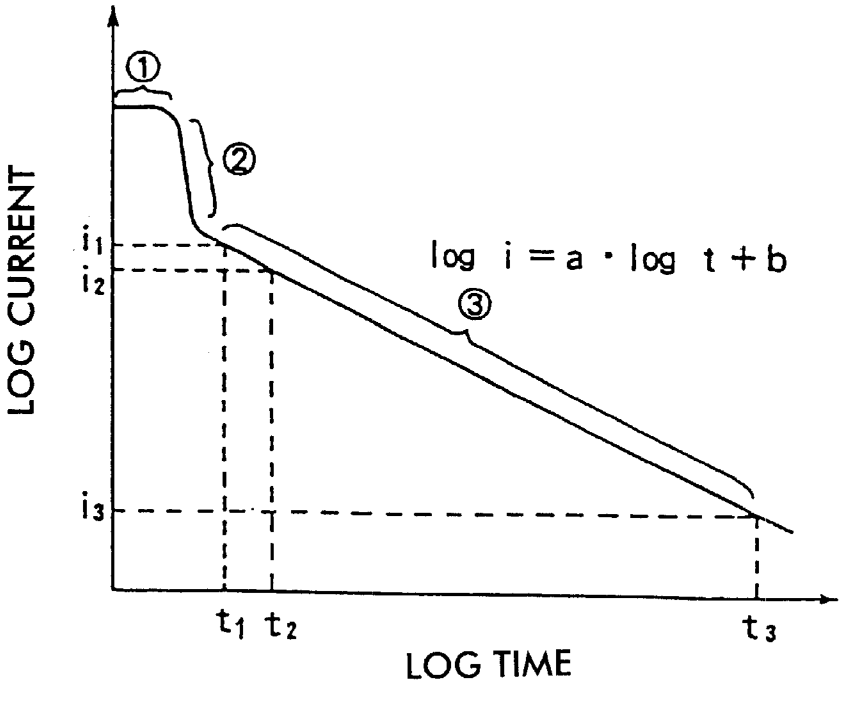
FIG. 19 is a characteristic diagram of a further embodiment of the insulation resistance prediction method in the invention.

More specifically, as shown in FIG. 19, since the charge region (3) of the dielectric polarization component D exhibits a linear characteristic, it is possible to accurately predict a final current value $i_3$ (the current value at an instant approximately 60 seconds later, for example) by measuring current values $i_1$, $i_2$ at a plurality of timings $t_1$, $t_2$ at the chargeup initiation region (3) of dielectric polarization component D and then obtaining from such plural measured current values $i_1$, $i_2$ the tangent "a" and intercept "b" of a linear approximation equation log i=a•log t+b. Measuring current values are not limited to two points. Measuring current values may be three or more points.

Second Embodiment of the Quality Discriminating Method

Figure 20:
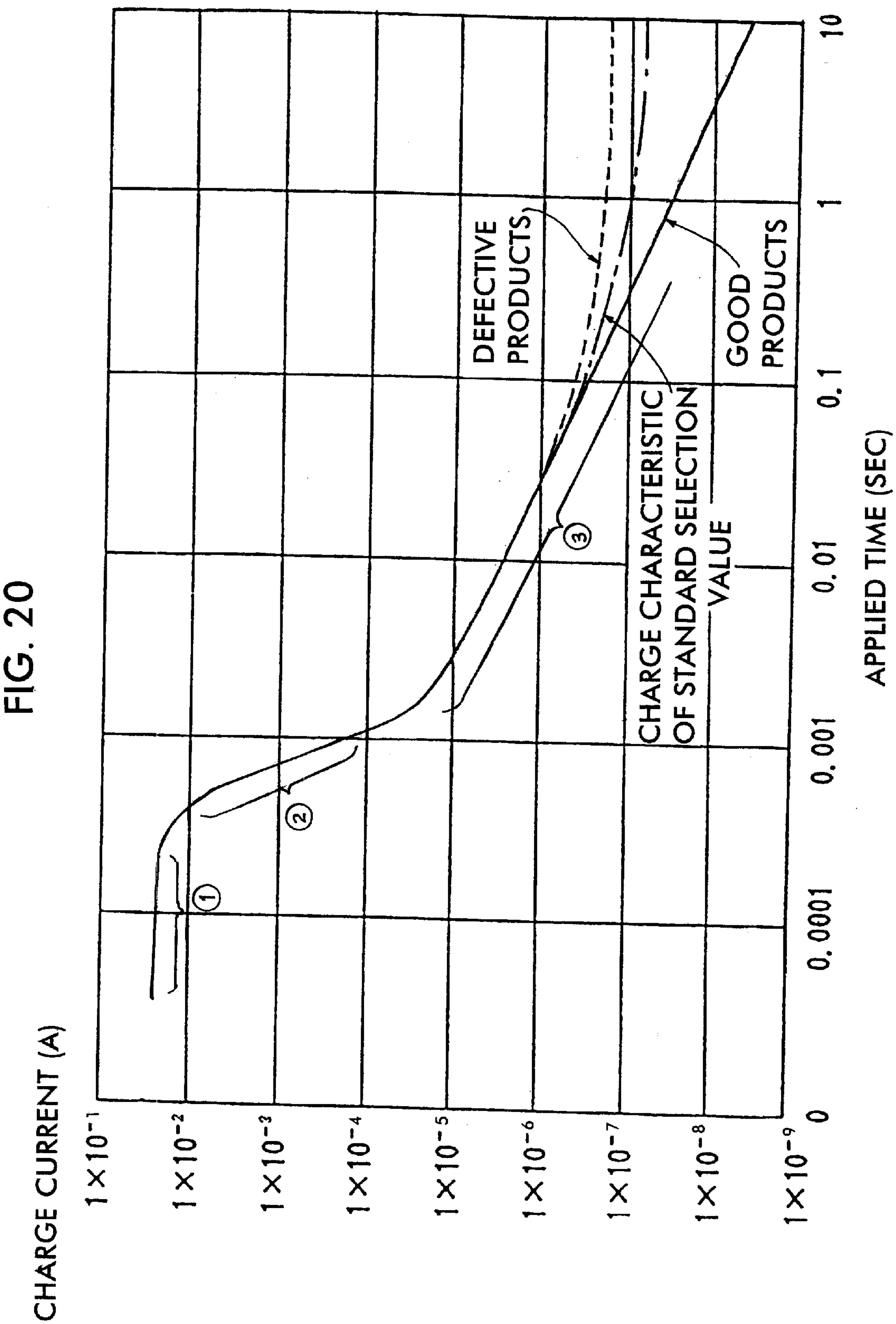
FIG. 20 is a characteristic diagram of a still further embodiment of the quality discriminating method in accordance with the present invention.

According to the first embodiment of the quality discriminating method, a current value in a charge termination period is predicted by an IR prediction section and the quality of the capacitor is discriminated from this predicted current value. Instead of this, according to a second embodiment described below, as shown by the two-dotted line of FIG. 20, a standard selection value charge characteristics is set in the intermediate area between acceptable capacitors (the solid line) and defective capacitors (the dotted line) and the quality of the capacitor is discriminated by comparing the actual measured current value characteristic of the dielectric polarization component of the capacitor to be measured and the standard selection value charge characteristic.

As a specific method for discriminating the quality of the capacitor, the evaluation function n(t) is defined:

$$n(t)=\log m(t)-\log j(t) \qquad \text{Equation (7)}$$

Here, m(t) designates an actual measured current value of the capacitor, j(t) is a calculated current value determined from the standard selection value charge characteristic. Then, the evaluation function n(t) is quadratic curve approximated and the quality is discriminated by whether the secondary coefficient d of the quadratic curve approximation formula $y=dx^2+ex+f$ is negative or positive. Note that the following equations can be used as the evaluation function other than Equation 7:

$$n(t)=\log m(t)/\log j(t) \qquad \text{Equation (8)}$$

$$n(t)=m(t)/j(t) \qquad \text{Equation (9)}$$

$$n(t)=m(t)-j(t) \qquad \text{Equation (10)}$$

Figure 21:
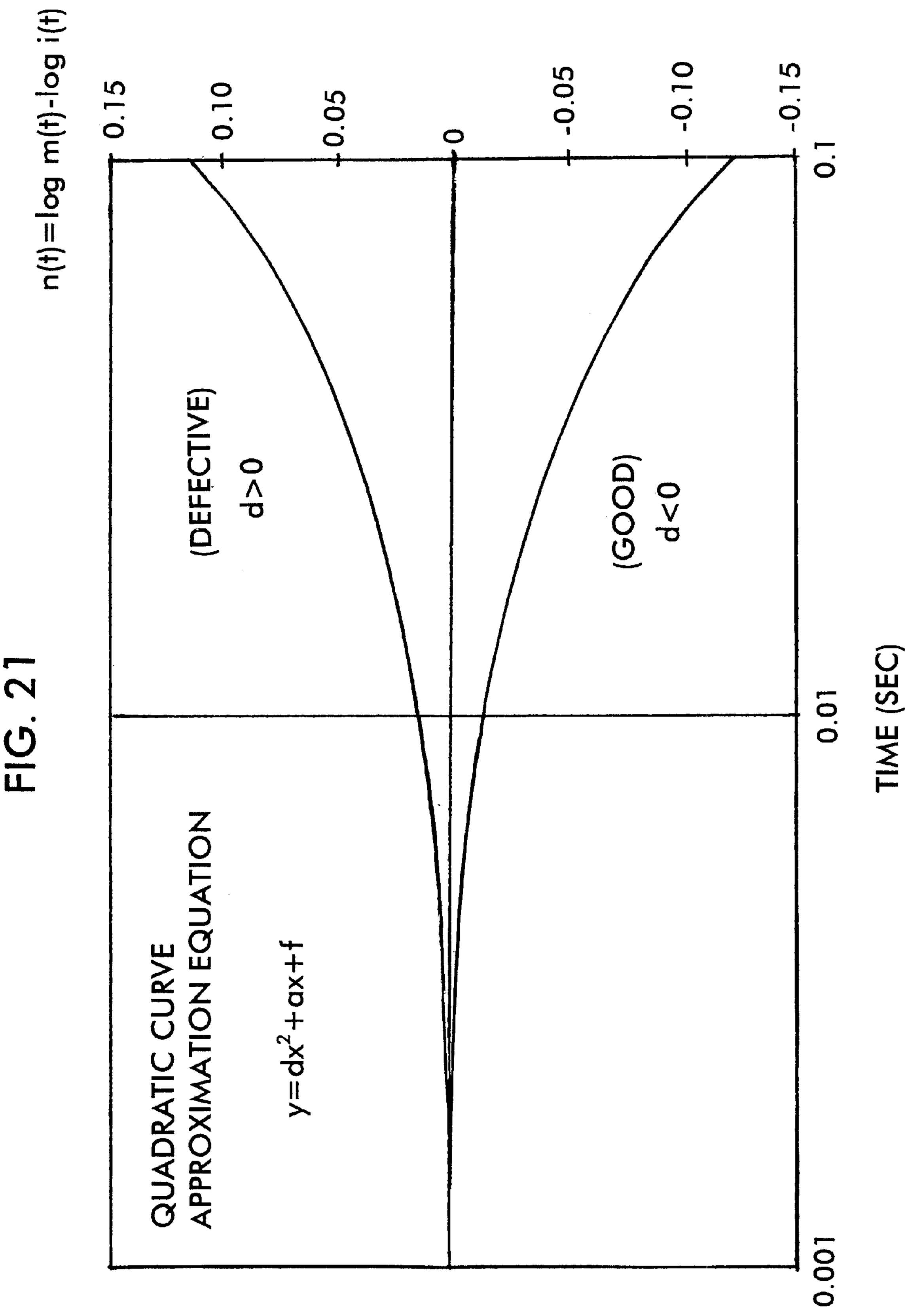
FIG. 21 is a diagram showing changes of the evaluation function n(t) as a function of the applied time in the embodiment of FIG. 20.

FIG. 21 shows changes of the evaluation function n(t) as a function of the applied time, and the quality of the capacitor can be discriminated by whether the secondary coefficient d is negative or positive. Namely, when "d" is positive, as time passes, since the decline velocity of the measured current value is smaller than the standard selection value charge characteristic, it is discriminated as defective. On the contrary, when "d" is negative, as time passes, since the decline velocity of the measured current value is larger than the standard selection value charge characteristic, it is discriminated as acceptable.

As a method for determining the standard selection value charge characteristic, the standard selection value charge characteristic may be set to a predetermined characteristic curve beforehand; it does not always coincide with the actual characteristic of the dielectric polarization component of the capacitor. Thus, like Equation (2), the current calculation formula can be modified by initial setting of the calculation current calculator formula of the dielectric polarization component using the equivalent circuit of the capacitor by determining the capacitances C1, C2 . . . Cn and the resistance R1, R2 . . . Rn, which are the dielectric polarization components of the equivalent circuit, such that the actual measured current value m(t) coincides with the calculated current value j(t) determined by the current calculation formula. According to this method, more accurate quality discrimination is possible because the standard selection value charge characteristic of the respective dielectric polarization component corresponding to each capacitor can be determined. Note that the determination method of capacitances C1, C2 . . . Cn and resistances R1, R2 . . . Rn is the same as described in FIG. 6.

Further, in order to evaluate the coincidence degree between the actual measured current value m(t) and the calculated current value j(t), an evaluation function n(t) similar to the quadratic curve approximation formulas is defined and this evaluation function n(t) is executed using a linear approximation, thereby modifying the current calculation formula easily.

Figure 22:
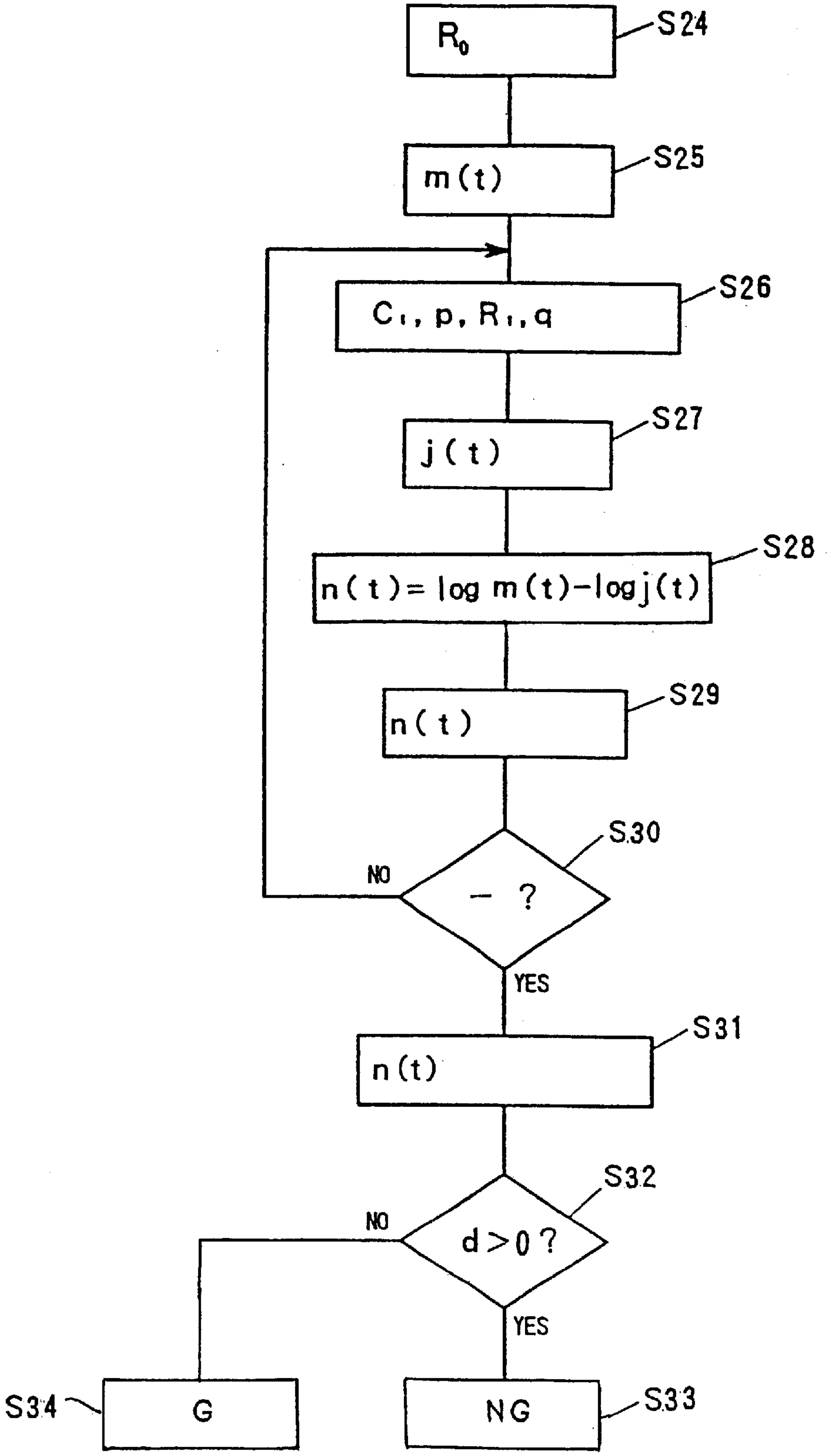
FIG. 22 is a flow chart showing a method for acceptable/defective products in the embodiment of FIG. 20.

Next, the flow of the quality discrimination method of the second embodiment will be explained with respect to FIG. 22.

First, the insulation resistance $R_0$ is set at a predetermined value (500M Ω or 1 G Ω, for example) in accordance with the type of capacitor (Step 24).

Next, a current value m(t) in the initial charge period (5 to 20 m seconds, for example) is measured (Step 25).

Then, parameters C1, R1, p and q are determined (Step 26). The initial values of these parameters may be known values by experience.

Next, a calculated current value j(t) is determined from current calculation Equation 2 using the determined parameters (Step 27).

An evaluation function n(t) is determined from Equation (7) (Step 28).

The evaluation function n(t) is executed using a linear approximation (Step 29).

The coincidence degree is judged using linear approximation (Step 30). More specifically, the coincidence degree is evaluated depending on whether or not both the gradient "a" and the intercept "b" are near zero. When the coincidence degree is low, parameters C1, R1, p and q are modified, and the process of Step 26 is repeated. Note that Steps 26 to 30 are the same as in FIG. 6.

When the coincidence degree of linear approximation is high, the evaluation function n(t) is executed using a quadratic curve approximation (Step 31). And it is judged whether the secondary coefficient "d" of the quadratic curve approximation equation is negative or positive (Step 32). When "d" is positive, the quality is discriminated as defective (Step 33), and when "d" is negative, the quality is discriminated as acceptable (Step 34).

It should be noted that capacitors related to the present invention are not exclusively limited to ceramic capacitors and may also be applicable to any other types of capacitors including electrolytic capacitors and film capacitors. Especially, IR prediction or quality discrimination using the dielectric polarization components is advantageously performed on certain capacitors with one or more dielectric polarization components. The transport means should not exclusively be limited to the turntable and belt; any other types of transport means are employable. Further, the drive scheme of the transport means should not be limited to the intermittent drive scheme only, but alternatively may be continuous driving techniques.

In the above embodiments the judgment for quality check was done based on the both measurement results of the capacitance measurement and the IR prediction; however, such quality-check judgment may be done independently after completion of the capacitance measurement and after the IR prediction. Accordingly, the capacitance measurement and IR prediction may be performed by separate facilities.

Note that as the logarithm used in the present invention, arbitrary logarithms such as common logarithm, natural logarithm, or the like can be used.

As is apparent from the foregoing explanation, the present invention is capable of measuring the insulation resistance within a significantly shortened time period because of the method for predicting the current value or the charge characteristic at the charge termination period by use of the current value or the charge characteristic of the capacitor at the initial charge period. This may make it possible to let the packing means and transport means of a taping device or the like operate in a direct cooperation fashion, which, in turn, enables those capacitors as selected at the transport means to be directly subjected to packing without requiring any extra processes between such selection and packing steps. This may result in noticeable enhancement of the work speed while at the same time reducing the size of facility and production costs.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A capacitor characteristic measuring apparatus, comprising:

means for applying a DC voltage to a capacitor; and means for discriminating the quality of the capacitor from charge characteristics of the capacitor at an initial charge period, said quality discriminating means including:

a charge current measurement section for measuring an initial current value in a charge region of a dielectric polarization component of the capacitor;

setting means for setting a standard selection value charge characteristic of a dielectric polarization component of the capacitor; and judging means for judging the quality of the capacitor by comparing the initial measured current value of the dielectric polarization component of the capacitor and the standard selection value charge characteristic, said judging means including:

means for executing quadratic curve approximation to either one of the ratio of an actual measured value m(t) of the held capacitor and a calculated current value j(t) determined from the standard selection value charge characteristics, the difference between m(t) and j(t), the difference between the logarithm value of m(t) and the logarithm value of j(t), or the ration of the logarithm value of m(t) to the logarithm value of j(t); and means for judging the quality of the capacitor depending on whether a secondary coefficient of the quadratic curve approximation is negative or positive.

2. A capacitor characteristics measuring and packing apparatus, comprising:

transport means driven in a predefined direction and having holders provided at equal intervals for holding respective capacitors therein;

supply means provided adjacent to the transport means for sending and supplying capacitors to the holders of the transport means;

quality discriminating means provided on a movement locus at the holders of the transport means for applying a DC voltage to a capacitor held by one of the holders and discriminating the quality of the held capacitor from charge characteristics of the held capacitor at an initial charge period, said quality discriminating means including:

a charge current measurement section for measuring an initial current valve in a charge region of a dielectric polarization component of the held capacitor;

setting means for setting a standard selection value charge characteristic of a dielectric polarization component of the held capacitor; and judging means for judging the quality of the held capacitor by comparing the initial measured current value of the dielectric polarization component of the held capacitor and the standard selection value charge characteristic, said judging means including:

means for executing quadratic curve approximation to either one of the ratio of an actual measured value m(t) of the held capacitor and a calculated current value j(t) determined from the standard selection value charge characteristics, the difference between m(t) and j(t), the difference between the logarithm value of m(t) and the logarithm value of j(t), or the ratio of the logarithm value of m(t) to the logarithm value of j(t);

means for judging the quality of the held capacitor depending on whether a secondary coefficient of the quadratic curve approximation is negative or positive;

an acceptable product extraction section provided adjacent to the transport means for ejecting from the holder section of the transport means a capacitor determined to be acceptable at the quality discriminating means;

a defective product ejection section provided adjacent to the transport means for ejecting from the holder section of the transport means a capacitor determined to be defective at the quality discriminating section; and packing means disposed corresponding to the acceptable product extraction section for packing those acceptable capacitors.

3. The capacitor characteristics measurement and packing apparatus according to claim 2, wherein said transport means is a turn table having holders for holding capacitors along the outer circular periphery at equal pitch intervals.

4. The capacitor characteristics measurement and packing apparatus according to claim 2, wherein said transport means is an endless belt with holders for holding capacitors at equal pitch intervals.

5. The capacitor characteristics measurement and packing apparatus according to claim 2, wherein said packing means is taping means for housing an acceptable capacitor taken out of the acceptable product extraction section into a storage section of a base material tape, and for thereafter pasting a cover tape onto the base material tape.

6. The capacitor characteristics measurement and packing apparatus according to claim 2, wherein said packing means is case-packing means for storing in a case a group of a predetermined number of acceptable capacitors as taken out of the acceptable product extraction section.

* * * * *